(12) United States Patent  (10) Patent No.: US 9,184,767 B2
Vernon  (45) Date of Patent: Nov. 10, 2015

(54) SCORING VARIABLE NODES FOR LOW DENSITY PARITY CHECK CODE DECODING

(71) Applicant: Fusion-io, Inc., Salt Lake City, UT (US)

(72) Inventor: Mark Vernon, Park City, UT (US)

(73) Assignee: SanDisk Technologies, Inc., Plano, TX (US)

( * ) Notice: Subject to any disclaimer, the term of this patent is extended or adjusted under 35 U.S.C. 154(b) by 77 days.

(21) Appl. No.: 14/069,138

(22) Filed: Oct. 31, 2013

(65) Prior Publication Data

US 2015/0082126 A1   Mar. 19, 2015

Related U.S. Application Data

(60) Provisional application No. 61/880,053, filed on Sep. 19, 2013.

(51) Int. Cl.
*H03M 13/11*   (2006.01)
*H03M 13/25*   (2006.01)

(52) U.S. Cl.
CPC ...... *H03M 13/1108* (2013.01); *H03M 13/1117* (2013.01); *H03M 13/255* (2013.01)

(58) Field of Classification Search
CPC .......... H03M 13/116; H03M 13/1137; H03M 13/114; H03M 13/1111; H03M 13/1117; H03M 13/1128; H03M 13/255; H03M 13/1108
USPC .......................... 714/752, 758, 774, 786, 780
See application file for complete search history.

(56) References Cited

U.S. PATENT DOCUMENTS

| | | | |
|---|---|---|---|
| 8,266,493 B1 | 9/2012 | Abbaszadeh et al. | |
| 8,352,827 B2 | 1/2013 | Gong et al. | |
| 8,543,883 B2 * | 9/2013 | Chen et al. | 714/752 |
| 8,555,131 B2 * | 10/2013 | Rault et al. | 714/752 |
| 8,645,802 B2 * | 2/2014 | Obata et al. | 714/774 |
| 8,739,004 B2 * | 5/2014 | Olcay et al. | 714/780 |
| 2012/0239868 A1 | 9/2012 | Ryan et al. | |

OTHER PUBLICATIONS

Ta, Tuan, "A Tutorial on Low Density Parity-Check Codes", The University of Texas at Austin, downloaded as early as Aug. 2, 2013.
Nguyen, Dung Viet, "Two-Bit Bit Flipping Decoding of LDPC Codes", University of Arizona, Mar. 3, 2011, pp. 6.

* cited by examiner

*Primary Examiner* — James C Kerveros
(74) *Attorney, Agent, or Firm* — Kunzler Law Group, PC

(57) ABSTRACT

Apparatuses, systems, methods, and computer program products are disclosed for error correcting code (ECC) decoding. A score module is configured to assign a score to a variable node of low density parity check (LDPC) code decoder. The LDPC code decoder may include a plurality of variable nodes associated with a plurality of check nodes. The plurality of variable nodes may correspond to bits of a received code word. The score for the variable node may be based on a count of unsatisfied check nodes associated with the variable node. A variable node update module is configured to update the variable node based on the score. A check node update module is configured to update one or more of the check nodes based on the updated variable node.

22 Claims, 8 Drawing Sheets

First Function 510

|  | | Previous Score | | | | | | | |
|---|---|---|---|---|---|---|---|---|---|
|  | | 0 | 1 | 2 | 3 | 4 | 5 | 6 | 7 |
| Count of Unsatisfied Check Nodes | 0 | 0 | 0 | 0 | 1 | 5 | 6 | 7 | 7 |
|  | 1 | 0 | 0 | 1 | 2 | 4 | 5 | 6 | 7 |
|  | 2 | 0 | 1 | 2 | 3 | 3 | 4 | 5 | 6 |
|  | 3 | 1 | 2 | 3 | 4 | 2 | 3 | 4 | 5 |
|  | 4 | 2 | 3 | 4 | 5 | 1 | 2 | 3 | 4 |
|  | 5 | 3 | 4 | 5 | 6 | 0 | 1 | 2 | 3 |

Score = Previous Score - Count + 1, if Previous Score >= 4
Score = Previous Score + Count - 2, if Previous Score < 4
Score is restricted to a range from 0 to 7

Second Function 520

|  | | Previous Score | | | | | | | |
|---|---|---|---|---|---|---|---|---|---|
|  | | 0 | 1 | 2 | 3 | 4 | 5 | 6 | 7 |
| Count of Unsatisfied Check Nodes | 0 | 0 | 0 | 0 | 1 | 4 | 5 | 6 | 7 |
|  | 1 | 0 | 0 | 1 | 2 | 3 | 4 | 5 | 6 |
|  | 2 | 0 | 1 | 2 | 3 | 2 | 3 | 4 | 5 |
|  | 3 | 1 | 2 | 3 | 4 | 1 | 2 | 3 | 4 |
|  | 4 | 2 | 3 | 4 | 5 | 0 | 1 | 2 | 3 |
|  | 5 | 3 | 4 | 5 | 6 | 0 | 0 | 1 | 2 |

Score = Previous Score - Count, if Previous Score >= 4
Score = Previous Score + Count - 2, if Previous Score < 4
Score is restricted to a range from 0 to 7

FIG. 5

SCORING VARIABLE NODES FOR LOW DENSITY PARITY CHECK CODE DECODING

CROSS-REFERENCES TO RELATED APPLICATIONS

This application claims the benefit of U.S. Provisional Patent Application No. 61/880,053 entitled "SCORING VARIABLE NODES FOR LOW DENSITY PARITY CHECK CODE DECODING" and filed on Sep. 19, 2013 for Mark Vernon, which is incorporated herein by reference.

TECHNICAL FIELD

The present disclosure, in various embodiments, relates to error correction codes and more particularly relates to hard-decision decoders for low density parity check codes.

BACKGROUND

Error correcting codes encode data redundantly to compensate for data errors in noisy communication channels. As data storage densities and transmission rates increase, the effects of error-causing disturbances may become more pronounced, leading to increased error rates. Low density parity check (LDPC) codes offer error correction performance close to a theoretical maximum.

Soft-decision LDPC code decoders achieve high error correction performance by operating on data that takes on a range of values between zero and one, unlike hard-decision LDPC code decoders, which operate on binary data. However, soft-decision decoders use more bandwidth to receive data values in a larger range, and have a higher computation cost than hard-decision decoders. Hard-decision decoders use less bandwidth and have a lower computational cost, but often have worse error correction performance than soft-decision decoders, especially with less computationally intensive types of LDPC codes. Many hard-decision decoders also have low throughput due to routing time involved in passing messages among decoder nodes.

SUMMARY

Methods are presented for error correcting code (ECC) decoding. In one embodiment, a method includes assigning a score to a variable node of a low density parity check (LDPC) code decoder. In a certain embodiment, the LDPC code decoder may include a plurality of variable nodes associated with a plurality of check nodes. In a further embodiment, the plurality of variable nodes may correspond to bits of a received code word. In some embodiments the score for the variable node may be based on a count of unsatisfied check nodes associated with the variable node. In certain embodiments, the method includes updating the variable node based on the score. In further embodiments the method includes updating one or more of the check nodes based on the updated variable node.

Apparatuses are presented for ECC decoding. In one embodiment, a plurality of variable nodes of an LDPC code decoder correspond to bits of a received code word. In a certain embodiment, a score module of the LDPC code decoder is configured to iteratively calculate scores for the variable nodes. In a further embodiment, the score for a variable node may be based on a count of unsatisfied check nodes associated with the variable node. In some embodiments, a variable node update module of the LDPC code decoder is configured to iteratively revise one or more of the variable nodes based on the score. In a further embodiment, a check node update module of the LDPC code decoder is configured to iteratively revise one or more of the check nodes based on the updated variable nodes.

An apparatus, in another embodiment, includes means for determining a score for a message node of a plurality of message nodes for an error correcting code (ECC) decoder. In a certain embodiment, the plurality of message nodes correspond to bits of a received code word. In a further embodiment, the score for the message node may be based on a count of unsatisfied check nodes associated with the message node. In some embodiments, the apparatus includes means for toggling the message node in response to the score crossing a score threshold. In further embodiments, the apparatus includes means for toggling one or more of the check nodes associated with the message node in response to the score crossing the score threshold.

Computer program products are presented comprising a computer readable storage medium storing computer usable program code executable to perform operations for ECC decoding. In one embodiment, the operations include assigning scores to subcode nodes of an LDPC code decoder. In a certain embodiment, the LDPC code decoder may include a plurality of subcode nodes associated with a plurality of check nodes. In a further embodiment, the plurality of subcode nodes may correspond to bits of a received code word. In some embodiments, the score for a subcode node is based on a count of unsatisfied check nodes associated with the subcode node. In certain embodiments, the operations include toggling one or more of the subcode nodes in response to scores for the one or more subcode nodes crossing a score threshold. In further embodiments, the operations include toggling one or more of the check nodes in response to scores for one or more subcode nodes associated with the one or more check nodes crossing the score threshold. In certain embodiments, the operations include interleaving decoding for at least two code words by assigning scores and toggling subcode nodes in an iteration for a first code word while toggling check nodes in an iteration for a second code word, and by toggling check nodes in the iteration for the first code word while assigning scores and toggling subcode nodes in a new iteration for the second code word. In one embodiment, the embodiments include stopping the iterations for assigning scores, toggling subcode nodes, and toggling check nodes, in response to an iteration limit being reached and/or the plurality of check nodes being satisfied.

BRIEF DESCRIPTION OF THE DRAWINGS

In order that the advantages of the disclosure will be readily understood, a more particular description of the disclosure briefly described above will be rendered by reference to specific embodiments that are illustrated in the appended drawings. Understanding that these drawings depict only typical embodiments of the disclosure and are not therefore to be considered to be limiting of its scope, the disclosure will be described and explained with additional specificity and detail through the use of the accompanying drawings, in which:

FIG. 5 is a set of tables illustrating two embodiments of functions for scoring variable nodes;

DETAILED DESCRIPTION

Figure 1A:
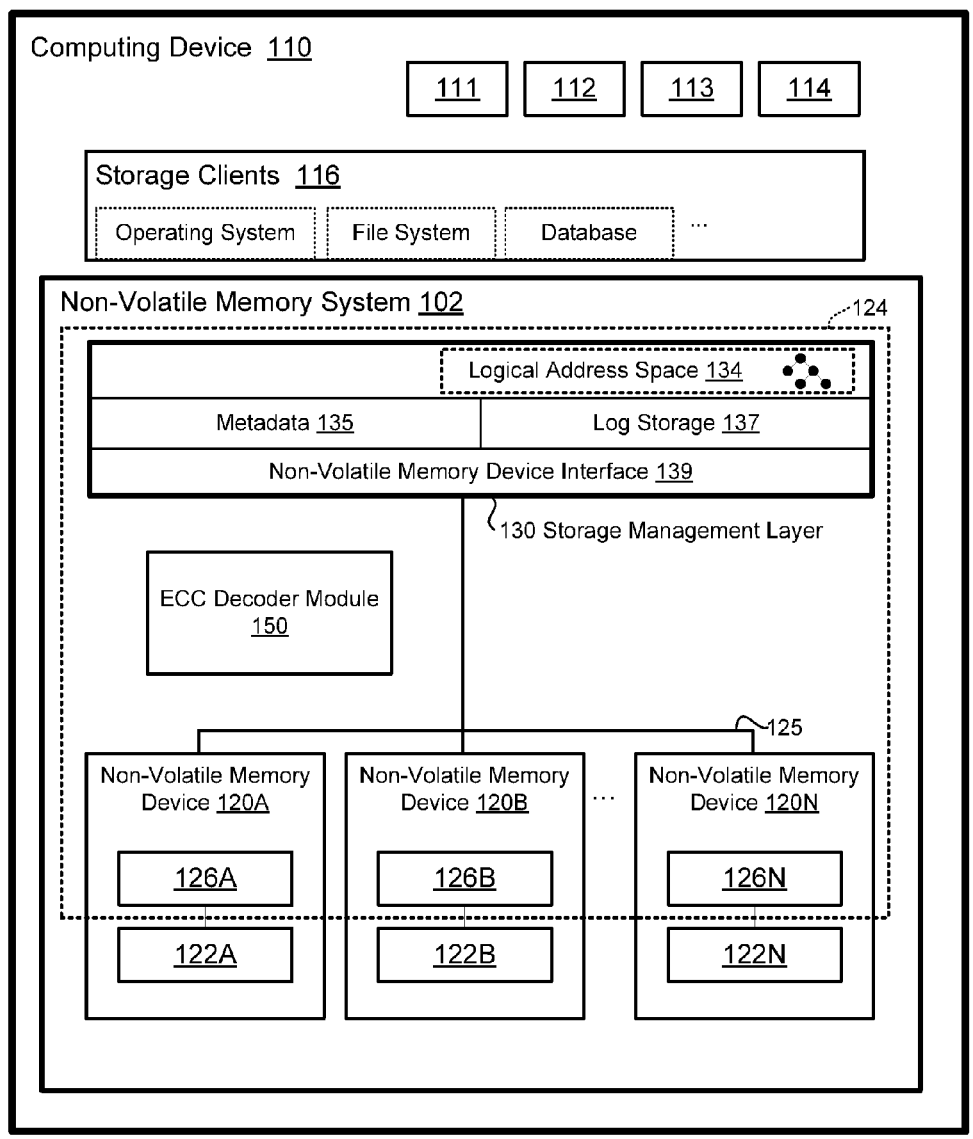
FIG. 1A is a schematic block diagram illustrating one embodiment of a non-volatile memory system comprising an error correcting code (ECC) decoder module.

Aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable storage media having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable storage media.

Any combination of one or more computer readable storage media may be utilized. A computer readable storage medium may be, for example, but not limited to, an electronic, magnetic, optical, electromagnetic, infrared, or semiconductor system, apparatus, or device, or any suitable combination of the foregoing.

More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), phase change memory (PRAM or PCM), a portable compact disc read-only memory (CD-ROM), a digital versatile disc (DVD), a blu-ray disc, an optical storage device, a magnetic tape, a Bernoulli drive, a magnetic disk, a magnetic storage device, a punch card, integrated circuits, other digital processing apparatus memory devices, or any suitable combination of the foregoing, but would not include propagating signals. In the context of this document, a computer readable storage medium may be any tangible medium that can contain, or store a program for use by or in connection with an instruction execution system, apparatus, or device.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the disclosure may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the disclosure. However, the disclosure may be practiced without one or more of the specific details, or with other methods, components, materials, and so forth. In other instances, well-known structures, materials, or operations are not shown or described in detail to avoid obscuring aspects of the disclosure.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the schematic flowchart diagrams and/or schematic block diagrams block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present disclosure. In this regard, each block in the schematic flowchart diagrams and/or schematic block diagrams may represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer instructions.

The description of elements in each figure may refer to elements of proceeding figures. Like numbers refer to like elements in all figures, including alternate embodiments of like elements.

According to various embodiments, a non-volatile memory controller manages one or more non-volatile memory devices. The non-volatile memory device(s) may comprise memory or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device). Memory units may include, but are not limited to: pages, memory divisions, erase blocks, sectors, blocks, collections or sets of physical storage locations (e.g., logical pages, logical erase blocks, described below), or the like.

The non-volatile memory controller may comprise a storage management layer (SML), which may present a logical address space to one or more storage clients. One example of an SML is the Virtual Storage Layer® of Fusion-io, Inc. of Salt Lake City, Utah. Alternatively, each non-volatile memory device may comprise a non-volatile memory media controller, which may present a logical address space to the storage clients. As used herein, a logical address space refers to a logical representation of memory resources. The logical address space may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The SML may maintain metadata, such as a forward index, to map logical addresses of the logical address space to media storage locations on the non-volatile memory device(s). The SML may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML may map logical addresses to physical data resources of any size and/or granularity, which may or may not correspond to the underlying data partitioning scheme of the non-volatile memory device(s). For example, in some embodiments, the non-volatile memory controller is configured to store data within logical memory units that are formed by logically combining a plurality of physical memory units, which may allow the non-volatile memory controller to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (each non-volatile memory element being accessible in parallel). As used herein, a logical memory division refers to a set of two or more physical memory divisions, each physical memory division on a respective non-volatile memory element in the respective logical memory element.

The logical address space presented by the storage management layer may have a logical capacity, which may correspond to the number of available logical addresses in the logical address space and the size (or granularity) of the data referenced by the logical addresses. For example, the logical capacity of a logical address space comprising 2^32 unique logical addresses, each referencing 2048 bytes (2 KiB) of data may be 2^43 bytes. (As used herein, a kibibyte (KiB) refers to 1024 bytes). In some embodiments, the logical address space may be thinly provisioned. As used herein, a "thinly provisioned" logical address space refers to a logical address space having a logical capacity that exceeds the physical capacity of the underlying non-volatile memory device(s). For example, the storage management layer may present a 64-bit logical address space to the storage clients (e.g., a logical address space referenced by 64-bit logical addresses), which exceeds the physical capacity of the underlying non-volatile memory devices. The large logical address space may allow storage clients to allocate and/or reference contiguous ranges of logical addresses, while reducing the chance of naming conflicts. The storage management layer may leverage the any-to-any mappings between logical addresses and physical storage resources to manage the logical address space independently of the underlying physical storage devices. For example, the storage management layer may add and/or remove physical storage resources seamlessly, as needed, and without changing the logical addresses used by the storage clients.

The non-volatile memory controller may be configured to store data in a contextual format. As used herein, a contextual format refers to a self-describing data format in which persistent contextual metadata is stored with the data on the physical storage media. The persistent contextual metadata provides context for the data it is stored with. In certain embodiments, the persistent contextual metadata uniquely identifies the data that the persistent contextual metadata is stored with. For example, the persistent contextual metadata may uniquely identify a sector of data owned by a storage client from other sectors of data owned by the storage client. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In a certain embodiment, the persistent contextual metadata identifies at least one of a plurality of aspects, including data type, a unique data identifier, an operation, and a sequence of operations performed on the data. The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile memory media, a memory division index, or the like).

In some embodiments, the contextual data format may allow data context to be determined (and/or reconstructed) based upon the contents of the non-volatile memory media, and independently of other metadata, such as the arbitrary, any-to-any mappings discussed above. Since the media location of data is independent of the logical address of the data, it may be inefficient (or impossible) to determine the context of data based solely upon the media location or media address of the data. Storing data in a contextual format on the non-volatile memory media may allow data context to be determined without reference to other metadata. For example, the contextual data format may allow the metadata to be reconstructed based only upon the contents of the non-volatile memory media (e.g., reconstruct the any-to-any mappings between logical addresses and media locations).

In some embodiments, the non-volatile memory controller may be configured to store data on one or more asymmetric, write-once media, such as solid-state storage media. As used herein, a "write once" storage medium refers to a storage medium that is reinitialized (e.g., erased) each time new data is written or programmed thereon. As used herein, an "asymmetric" storage medium refers to a storage medium having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media). The memory media may be partitioned into memory divisions that can be erased as a group (e.g., erase blocks) in order to, inter alia, account for the asymmetric properties of the media. As such, modifying a single data segment in-place may require erasing the entire erase block comprising the data, and rewriting the modified data to the erase block, along with the original, unchanged data. This may result in inefficient "write amplification," which may excessively wear the media. Therefore, in some embodiments, the non-volatile memory controller may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (the erasure latency is no longer part of the critical path of a write operation).

The non-volatile memory controller may comprise one or more processes that operate outside of the regular path for servicing of storage operations (the "path" for performing a storage operation and/or servicing a storage request). As used herein, the "path for servicing a storage request" or "path for servicing a storage operation" (also referred to as the "critical path") refers to a series of processing operations needed to service the storage operation or request, such as a read, write, modify, or the like. The path for servicing a storage request may comprise receiving the request from a storage client, identifying the logical addresses of the request, performing one or more storage operations on non-volatile memory media, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller comprises a groomer, which is configured to reclaim memory divisions (e.g., erase blocks) for reuse. The write out-of-place paradigm implemented by the non-volatile memory controller may result in obsolete or invalid data remaining on the non-volatile memory media. For example, overwriting data X with data Y may result in storing Y on a new memory division (rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media may accumulate a significant amount of invalid data. A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller may be further configured to store data in a log format. As described above, a log format refers to a data format that defines an ordered sequence of storage operations performed on a non-volatile memory media. In some embodiments, the log format comprises storing data in a pre-determined sequence of media addresses of the non-volatile memory media (e.g., within sequential pages and/or erase blocks of the media). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller may maintain a current append point at a media address of the non-volatile memory device. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller may identify the "next" available memory division (the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media, and independently of other metadata. As discussed above, invalid data may not be removed from the non-volatile memory media until the memory division comprising the data is reclaimed. Therefore, multiple "versions" of data having the same context may exist on the non-volatile memory media (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description.

FIG. 1A is a block diagram of one embodiment of a system 100 comprising an error correcting code (ECC) decoder module 150. The ECC decoder module 150 may be part of and/or in communication with a storage management layer (SML) 130. The SML 130 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 (and/or non-volatile memory controller 124) to a communication network, such as an Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the storage management layer 130 and/or one or more modules thereof may be embodied as one or more computer readable instructions stored on the non-transitory storage media 114.

The storage management layer 130 may be configured to provide storage services to one or more storage clients 116. The storage clients 116 may include local storage clients 116 operating on the computing device 110 and/or remote, storage clients 116 accessible via the network (and network interface 113). The storage clients 116 may include, but are not limited to: operating systems, file systems, database applications, server applications, kernel-level processes, user-level processes, applications, and the like.

Figure 1B:
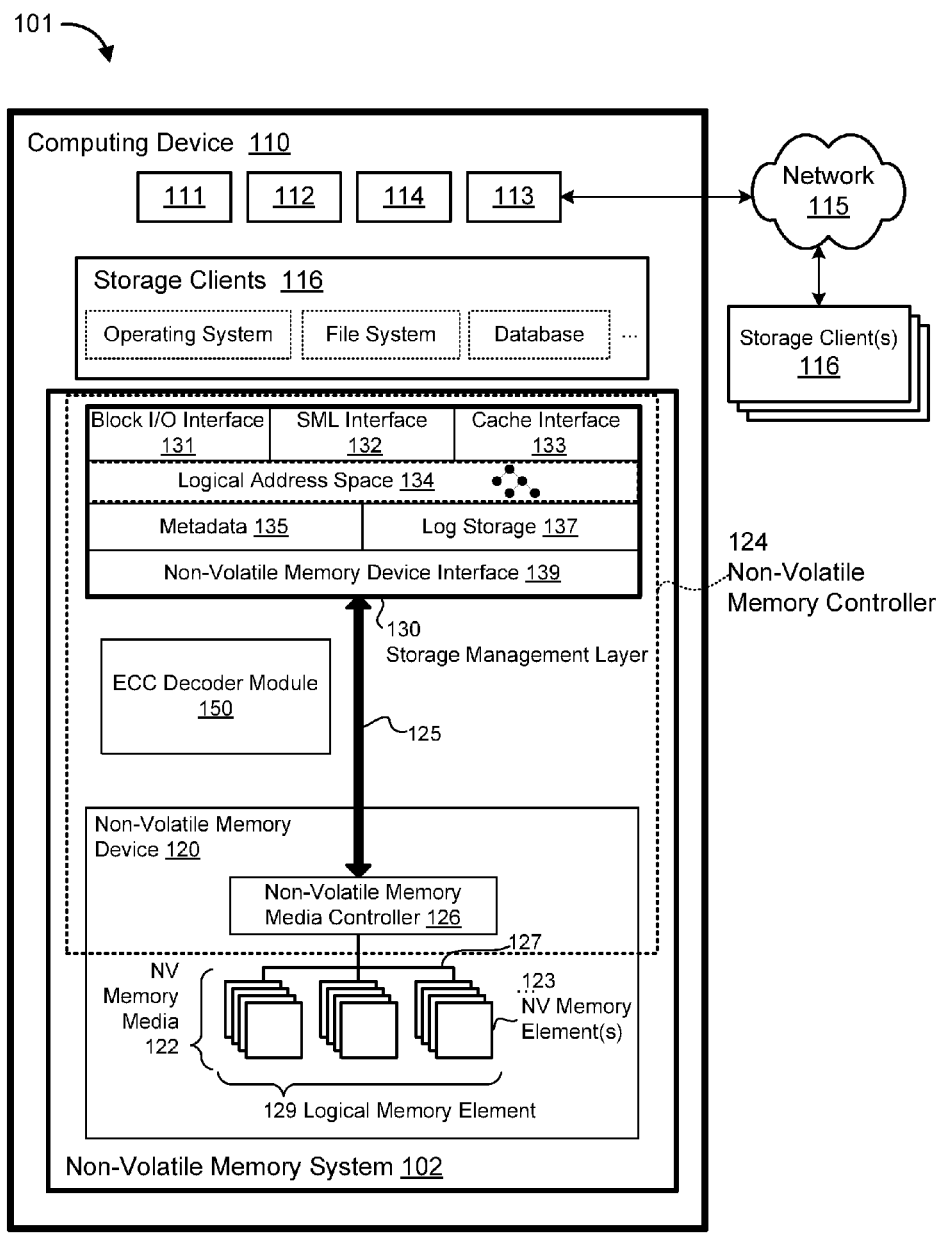
FIG. 1B is a schematic block diagram illustrating another embodiment of a non-volatile memory system comprising an ECC decoder module.

The storage management layer 130 comprises and/or is communicatively coupled to one or more non-volatile memory devices 120A-N. The non-volatile memory devices 120A-N may include different types of non-volatile memory devices including, but not limited to: solid-state storage devices, hard drives, SAN storage resources, or the like. The non-volatile memory devices 120A-N may comprise respective non-volatile memory media controllers 126A-N and non-volatile memory media 122A-N. As illustrated in FIG. 1B, The SML 130 may provide access to the non-volatile memory devices 120A-N via a traditional block I/O interface 131. Additionally, the SML 130 may provide access to enhanced functionality (large, virtual address space) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the non-volatile memory devices 120A-N and/or the non-volatile memory media controllers 126A-N.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations on one or more of the non-volatile memory devices 120A-N. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122A-N, which define an ordered sequence of storage operations performed on the non-volatile memory devices 120A-N, as described above.

The SML 130 may further comprise a non-volatile memory device interface 139 configured to transfer data, commands, and/or queries to the non-volatile memory devices 120A-N over a bus 125, which may include, but is not limited to: a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network, Infiniband, SCSI RDMA, or the like. The non-volatile memory device interface 139 may communicate with the non-volatile memory devices 120A-N using input-output control (IO-CTL) command(s), IO-CTL command extension(s), remote direct memory access, or the like.

The non-volatile memory system 102, in the depicted embodiment, includes an ECC decoder module 150. The ECC decoder module 150, in one embodiment, is configured to assign a score to a variable node of a low density parity check (LDPC) code decoder. The LDPC code decoder, in a further embodiment, may include a plurality of variable nodes associated with a plurality of check nodes. In certain embodiments, the variable nodes may correspond to bits of a received code word. In some embodiments, the score for the variable node is based on a count of unsatisfied check nodes associated with the variable node. In one embodiment, the ECC decoder module 150 is configured to update the variable node based on the score. In a further embodiment, the ECC decoder module 150 is configured to update one or more of the check nodes based on the updated variable node. Assigning scores to variable nodes generates information for a hard-decision decoder similar to the range of values received by a soft-decision decoder, thus providing a hard-decision decoder with higher error correction performance while allowing the decoder to avoid routing delays caused by explicitly passing messages among nodes.

In one embodiment, the ECC decoder module 150 may comprise executable software code, such as a device driver, SML 130, or the like, stored on the computer readable storage media 114 for execution on the processor 111. In another embodiment the ECC decoder module 150 may comprise logic hardware of one or more of the non-volatile memory devices 120A-N, such as a non-volatile memory media controller 126A-N, a non-volatile memory controller 124, a device controller, a field-programmable gate array (FPGA) or other programmable logic, firmware for an FPGA or other programmable logic, microcode for execution on a microcontroller, an application-specific integrated circuit (ASIC), or the like. In a further embodiment, the ECC decoder module 150 may include a combination of both executable software code and logic hardware.

In one embodiment, the ECC decoder module 150 is configured to decode data in response to receiving storage requests from the SML 130 via a bus 125 or the like. The ECC decoder module 150 may be further configured to transfer data to/from the SML 130 and/or storage clients 116 via the bus 125. Accordingly, the ECC decoder module 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the ECC decoder module 150 may receive storage requests as an API call from a storage client 116, as an IO-CTL command, or the like. The ECC decoder module 150 is described in greater detail below with regard to FIGS. 3 and 4.

FIG. 1B is a block diagram of another embodiment of a system 101 comprising an ECC decoder module 150. As described above, the ECC decoder module 150 may be part of and/or in communication with a storage management layer 130. The SML 130 may operate on a non-volatile memory system 102 of a computing device 110, which, as discussed above, may comprise a processor 111, volatile memory 112, communication interface 113, and non-transitory, computer readable storage media 114. The communication interface 113 may comprise one or more network interfaces configured to communicatively couple the computing device 110 (and/or non-volatile memory controller 124) to a network 115 and/or to one or more remote, network-accessible storage clients 116.

The computing device 110 may comprise a non-volatile memory controller 124 that is configured to provide storage services to the storage clients 116. The storage clients 116 may include local storage clients 116 operating on the computing device 110 and/or remote, storage clients 116 accessible via the network 115 (and network interface 113). The non-volatile memory controller 124 comprises one or more non-volatile memory devices 120. Although FIG. 1B depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), resistive RAM (RRAM), programmable metallization cell (PMC), conductive-bridging RAM (CBRAM), magneto-resistive RAM (MRAM), dynamic RAM (DRAM), phase change memory (PRAM or PCM), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on (and read data from) the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (a page of each element of non-volatile memory media 122).

The non-volatile memory controller 124 may comprise a SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

Figure 2:
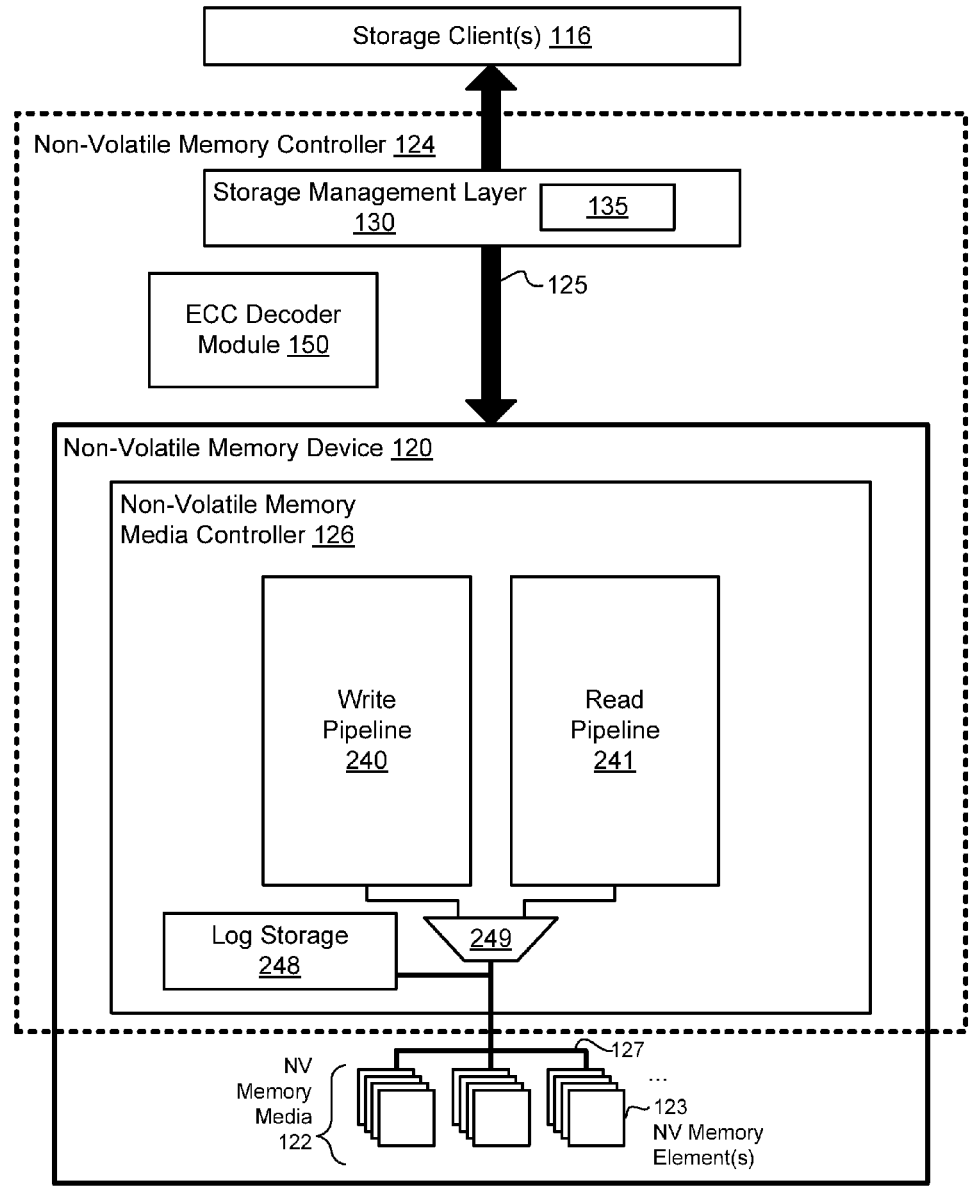
FIG. 2 is a schematic block diagram illustrating a further embodiment of a non-volatile memory system comprising an ECC decoder module.

FIG. 2 depicts another embodiment of a non-volatile memory controller 124 configured to decode data using an error correcting code. The non-volatile memory device 120 may comprise a non-volatile memory media controller 126 and non-volatile memory media 122. The non-volatile memory media 122 may comprise a plurality of non-volatile memory elements 123, which may be communicatively coupled to the non-volatile memory media controller 126 via a bus 127, as described above.

The non-volatile memory media controller 126 may comprise a write pipeline 240 that is configured to store data on the non-volatile memory media 122 in a contextual format in response to requests received via the bus 125. The requests may include and/or reference data to be stored on the non-volatile memory media 122, may include logical address(es) of the data, and so on. As described above, the contextual format may comprise storing a logical address of the data in association with the data on the non-volatile memory media 122. For example, the write pipeline 240 may be configured to format data into packets, and may include the logical address of the data in a packet header (or other packet field). The write pipeline 240 may be configured to buffer data for storage on the non-volatile memory media 122. In some embodiments, the write pipeline 240 may comprise one or more synchronization buffers to synchronize a clock domain of the non-volatile memory media controller 126 with a clock domain of the non-volatile memory media 122 (and/or bus 127).

The log storage module 248 may be configured to select media location(s) for the data and may provide addressing and/or control information to the non-volatile memory elements 123 via the bus 127. In some embodiments, the log storage module 248 is configured to store data sequentially in a log format within the non-volatile memory media. The log storage module 248 may be further configured to groom the non-volatile memory media, as described above. In certain embodiments the log storage module 248 is substantially similar to the log storage module 137 as described above. The log storage module 248 may be executed by the SML 130 and/or by the non-volatile memory media controller 126.

Upon writing data to the non-volatile memory media, the non-volatile memory media controller 126 may be configured to update metadata 135 (e.g., a forward index) to associate the logical address(es) of the data with the media address(es) of the data on the non-volatile memory media 122. In some embodiments, the metadata 135 may be maintained on the non-volatile memory media controller 126; for example, the metadata 135 may be stored on the non-volatile memory media 122, on a volatile memory (not shown), or the like. Alternatively, or in addition, the metadata 135 may be maintained within the SML 130 (e.g., on a volatile memory 112 of the computing device 110 of FIGS. 1A and 1B). In some embodiments, the metadata 135 may be maintained in a volatile memory by the SML 130, and may be periodically stored on the non-volatile memory media 122.

The non-volatile memory media controller 126 may further comprise a read pipeline 241 that is configured to read contextual data from the non-volatile memory media 122 in response to requests received via the bus 125. The requests may comprise a logical address of the requested data, a media address of the requested data, and so on. The read pipeline 241 may be configured to read data stored in a contextual format from the non-volatile memory media 122 and to provide the data to the SML 130 and/or a storage client 116. The read pipeline 241 may be configured to determine the media address of the data using a logical address of the data and the metadata 135. Alternatively, or in addition, the SML 130 may determine the media address of the data and may include the media address in the request. The log storage module 248 may provide the media address to the non-volatile memory elements 123, and the data may stream into the read pipeline 241 via a buffer. The read pipeline 241 may comprise one or more read synchronization buffers for clock domain synchronization, as described above.

The non-volatile memory media controller 126 may further comprise a multiplexer 249 that is configured to selectively route data and/or commands to/from the write pipeline 240 and the read pipeline 241. In some embodiments, non-volatile memory media controller 126 may be configured to read data while filling a buffer of the write pipeline 240 and/or may interleave one or more storage operations on one or more banks of non-volatile memory elements 123 (not shown).

Figure 3:
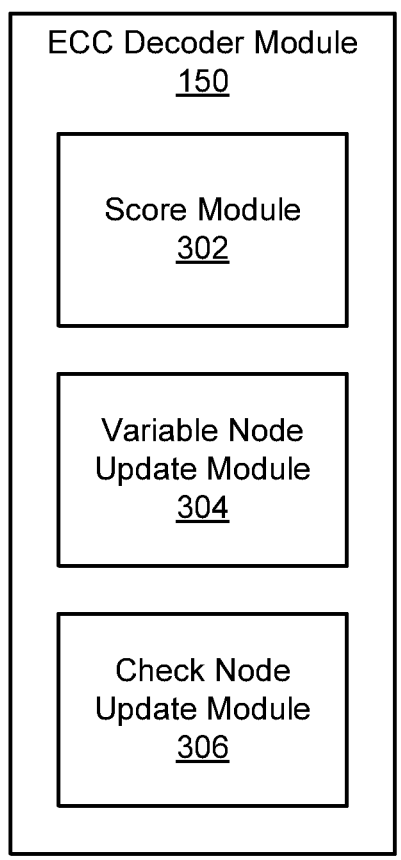
FIG. 3 is a schematic block diagram illustrating one embodiment of a an ECC decoder module.

FIG. 3 depicts one embodiment of an ECC decoder module 150. The ECC decoder module 150 may be substantially similar to the ECC decoder module 150 described above with regard to FIGS. 1A, 1B, and 2. In general, as described above, the ECC decoder module 150 decodes data by assigning scores to variable nodes of a low density parity check (LDPC) code decoder, updating the variable nodes based on the scores, and updating the check nodes based on the updated variable nodes. The ECC decoder module 150 may iteratively update the scores, the variable nodes, and the check nodes, until it decodes the data or reaches an iteration limit. For example, in one embodiment, each iteration may include assigning new or updated scores to variable nodes, updating or toggling variable nodes based on the scores, and updating or toggling the check nodes. LDPC code decoding is described in greater detail below. In the depicted embodiment, the ECC decoder module 150 includes a score module 302, a variable node update module 304, and a check node update module 306.

The score module 302, in one embodiment, is configured to assign or calculate scores for variable nodes of an LDPC code decoder. In various embodiments, a means for determining a score for a variable node of a plurality of variable nodes for an ECC decoder may include a score module 302, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for determining a score for a variable node In one embodiment, an LDPC code decoder may include a plurality of variable nodes associated with a plurality of check nodes. The terms "message node" or "subcode node" may also be used herein to refer to a variable node, and the term "digit node" may refer to a check node. In a certain embodiment, the plurality of variable nodes may correspond to bits of a received code word. For example, in one embodiment, a code word may be encoded data of the non-volatile memory device 120, and the LDPC code decoder may receive the code word from the non-volatile memory media 122 via a bus 127. In some embodiments, an original code word may be the product, modulo 2, of a binary generator matrix and an original, unencoded binary message. The received code word may differ from the original code word due to errors. Each variable node of the LDPC code decoder may store or track a value equal to a bit from the received code word, in response to receiving the code word. In certain embodiments, the LDPC code decoder uses the association between the variable nodes and the check nodes to update the values of the variable nodes, thus recovering the original code word without errors. Another matrix multiplication, applied to the recovered code word, may reverse the effect of the generator matrix and produce the unencoded message.

A parity check matrix may describe the association between the variable nodes and the check nodes. Each column of the parity check matrix may correspond to a variable node, and each row of the parity check matrix may correspond to a check node. An element in a row and column of the parity check matrix may be a binary value, so that a one indicates that the check node for the row and the variable node for the column are associated, and a zero indicates that the check node for the row and the variable node for the column are not associated.

The product, modulo 2, of the parity check matrix and a column vector of values for the variable nodes may produce values that are stored or tracked by the check nodes. In one embodiment, the LDPC code decoder may use hardware and algorithms generally capable of matrix multiplication to generate values for the check nodes. In another embodiment, the LDPC code decoder may equivalently determine the value of a check node by adding, modulo 2, the binary values of each variable node with which the check node is associated. Because an exclusive OR (XOR) operation is equivalent to addition modulo 2 of binary digits, the LDPC code decoder may, in some embodiments, determine values for each check node by performing a series of XOR operations.

If the value of each check node is zero, then the values of the variable nodes correspond to bits of a valid code word for the LDPC code, and the LDPC code decoder may recover a message from the valid code word. As used herein, a "satisfied" check node may refer to a check node with a value of zero, and an "unsatisfied" check node may refer to a check node with a value of one. Thus in certain embodiments, the original code word may be recovered without errors when the check nodes are satisfied. A satisfied check node may indicate that the values of the variable nodes associated with the check node include no errors, or an even number of errors. An unsatisfied check node may indicate that the values of the variable nodes associated with the check node include one error, or an odd number of errors. In some embodiments, the LDPC code decoder may change values of the variable nodes (e.g., by flipping bits) based on which check nodes are unsatisfied, until all the check nodes are satisfied.

The parity check matrix may be a sparse matrix, including mostly zeros. A column weight or row weight may refer to the number of binary ones in each column or row respectively. Thus, the column weight may indicate the number of check nodes associated with each variable node, and the row weight may indicate the number of variable nodes associated with each check node. For example, in one embodiment, a parity check matrix may have a column weight of 5 and a row weight of 70, so that each variable node is associated with 5 check nodes, and each check node is associated with 70 variable nodes. In another embodiment, a parity check matrix may have a column weight of 4 and a row weight of 56, so that each variable node is associated with 4 check nodes, and each check node is associated with 56 variable nodes. In various embodiments, an LDPC code decoder may use any of various column weights and row weights. Larger column weights and row weights may indicate a more complex association between the variable nodes and the check nodes, resulting in increased error correction performance but also resulting in increased computational complexity for the LDPC code decoder.

In one embodiment, the parity check matrix may be selected to provide low computational complexity for the LDPC code decoder. For example, in a certain embodiment, the parity check matrix for the LDPC code decoder may comprise a matrix of cyclically shifted identity matrices. A cyclically shifted identity matrix, in various embodiments, may include the identity matrix itself, or any version of the identity matrix shifted cyclically in any direction. Thus, an N by N cyclically shifted identity matrix may include N ones, either on the main diagonal, or on two diagonals, with zeros elsewhere, so that each row and column includes 1 one and N−1 zeros. An N by N cyclically shifted identity matrix, in further embodiments, may be a special case of an N by N circulant matrix, which is specified by an N-element column vector that appears in the first column and is shifted cyclically downward in remaining columns with an offset equal to the column index. Thus, an N by N cyclically shifted identity matrix may be an N by N circulant matrix specified by an N-element column vector that includes 1 one, in any position, and N−1 zeros.

In some embodiments, if the parity check matrix is a matrix of N by N cyclically shifted identity matrices, then multiplying N times the row weight gives the code word size, or number of variable nodes, and multiplying N times the column weight gives the number of check nodes for the LDPC code decoder. In one embodiment, continuing the column weight 5 example introduced above, a parity check matrix may comprise 5 rows and 70 columns of cyclically shifted 256 by 256 identity matrices. Thus, the LDPC code decoder in this embodiment may handle code words of 17,920 bits using 17,920 variable nodes and 1.280 check nodes. In another embodiment, continuing the column weight 4 example introduced above, the LDPC code decoder may also handle code words of 17,920 bits using 17,920 variable nodes and 1.280 check nodes, with a parity check matrix comprising 4 rows and 56 columns of cyclically shifted 320 by 320 identity matrices. In various embodiments, LDPC code decoders may handle various sizes of code words, numbers of variable nodes, and numbers of check nodes using various sizes of parity check matrices of varying column weights and row weights, which include matrices of cyclically shifted identity matrices.

Quasi-cyclic LDPC codes based on cyclically shifted identity matrices provide low computational complexity for an LDPC code decoder because applying a cyclically shifted identity matrix to a vector results in cyclically shifting the vector. Therefore, in some embodiments, if the parity check matrix is a matrix of N by N cyclically shifted identity matrices, calculating values for the check nodes may involve grouping the check notes and the variable nodes into groups of size N. Then, the LDPC code decoder may calculate values for each group of N check nodes by shifting each group of N variable nodes according to a corresponding cyclically shifted identity matrix, and adding the shifted values modulo 2. Thus, in a certain embodiment, an LDPC code decoder may calculate values for check nodes by shifting and adding groups of variable nodes. In a further embodiment, computational hardware for an LDPC code decoder may include barrel shifters (or other types of shifters) and adders for calculating values of check nodes by shifting and adding groups of variable nodes.

In some embodiments, an LDPC code decoder changes the values of some variable nodes in response to unsatisfied check nodes. In further embodiments, the LDPC code decoder may iteratively update variable nodes and recalculate values for check nodes until the check nodes are satisfied or the LDPC code decoder reaches an iteration limit. In certain embodiments, if the parity check matrix is a matrix of cyclically shifted identity matrices, the LDPC code decoder may handle a number of variable nodes corresponding to a size of one of the cyclically shifted identity matrices, in each iteration. As used herein, a (one-dimensional) number of variable nodes corresponds to the size of a (two-dimensional) cyclically shifted identity matrix if the number of variable nodes is equal to the number of rows or columns of the cyclically shifted identity matrix. For example, in one embodiment, if each of the cyclically shifted identity matrices is an N by N matrix, the LDPC code decoder may update a group of N variable nodes, and update the corresponding check nodes in groups of N check nodes by applying each cyclically shifted identity matrix in the column corresponding to the group of N variable nodes. In a further embodiment, with the check nodes updated, the LDPC code decoder may handle another group of N variable nodes in the next iteration, updating the new group of N variable nodes, updating the corresponding check nodes, and so on. Thus, in certain embodiments, each iteration of the score module 302, the variable node update module 304, and the check node update module 306 may handle a number of variable nodes corresponding to a size of one of the cyclically shifted identity matrices.

As described above, in one embodiment, the score module 302 is configured to assign scores to variable nodes of the LDPC code decoder. In certain embodiments, logic hardware of the score module 302 may store the score using a register, volatile memory, or the like. In a further embodiment, the score module 302 may iteratively assign scores to the variable nodes. In various embodiments, the score module 302 may assign a score to one, some, or all of the variable nodes. Because assigning scores to variable nodes generates information for a hard-decision decoder similar to the range of values received by a soft-decision decoder, and thus provides a hard-decision decoder with higher error correction performance, assigning scores to a larger number of variable nodes will increase the performance of a hard-decision LDPC code decoder.

In a certain embodiment, the score for a variable node may be based on the count of unsatisfied check nodes associated with the variable node. In some embodiments, the score for a variable node may include a multiple-bit value. For example, in one embodiment, the score may include a three bit value in a range from zero to seven. In another embodiment, the score may include a value with another bit width. The score, in certain embodiments, may indicate an estimated likelihood that the bit of the received code word corresponding to the variable node is in error. Conversely, in another embodiment, the score may indicate a determination or estimate that the corresponding bit of the received code word is not in error. In one embodiment, if the score is high, the estimated likelihood that the corresponding bit of the received code word is in error is high, and if the score is low, the estimated likelihood that the corresponding bit of the received code word is in error is low. For example, in a certain embodiment, continuing the three-bit score example introduced above, a score from four to seven (e.g., the most significant bit of the score is a binary one), may indicate that the corresponding bit of the received code word is likely in error, and a score from zero to three (e.g., the most significant bit of the score is a binary zero) may indicate that the corresponding bit is likely correct. In another embodiment, the relationship between the score and the estimated likelihood may be reversed, so a low score indicates that a bit is in error.

In some embodiments, the estimated likelihood may or may not be correct for any given iteration of the LDPC code decoder, but may change and/or improve as the score is updated in further iterations. In one embodiment, in a first iteration of the score module 302, an initial value for a variable node's score may be set at zero, the number of unsatisfied check nodes associated with the variable node, or another initial value, as an initial estimate of the likelihood that the corresponding bit is in error.

In a certain embodiment, if the number of errors in the received code word is small, then if the count of unsatisfied check nodes associated with a variable node is high, the corresponding bit of the received code word is likely to be in error, and if the count of unsatisfied check nodes is low, the corresponding bit is likely correct. In another embodiment, if the received code word includes a larger number of errors, the count of unsatisfied check nodes associated with a variable node may be low even if the corresponding bit is in error, due to associations of the check nodes with other variable nodes also corresponding to erroneous bits of the received code word. Thus, in a further embodiment, in a further iteration of the score module 302, the score module 302 may update, redetermine, or reassign the score based on an updated count of unsatisfied check nodes associated with the variable node, in response to the variable node update module 304 and the check node update module 306 updating the variable nodes and the check nodes, as described below.

In one embodiment, the score module 302 may calculate or assign the score for a variable node in one iteration by using a function that determines the score based on a previous score for the variable node, and the count of unsatisfied check nodes associated with the variable node. As used herein, a "function" that determines the score refers to any logic, method, algorithm, or procedure that returns a score based on the previous score and the count of unsatisfied check nodes. For example, in one embodiment, a function may include arithmetically calculating a score. In another embodiment, a function may include looking up a score using a pre-computed table that maps input values to output values. "Mapping," as used herein, also refers to a function. Thus, in various embodiments, a function for assigning the score may be any mapping from the previous score and the count of unsatisfied check nodes associated with the variable node, to a current score. Functions or mappings used by the score module 302 for assigning a score are described in further detail below with regard to the function select module 408 of FIG. 4, and with regard to FIG. 5.

The variable node update module 304, in one embodiment, is configured to update or revise a variable node based on the score for the variable node. In a further embodiment, the variable node update module 304 may iteratively update one or more of the variable nodes based on the scores. In various embodiments, a means for toggling a variable node may include a variable node update module 304, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for updating a variable node.

In various embodiments, "updating" a variable node may refer to changing the value of the variable node (e.g., by flipping a bit), determining not to change the value of the variable node (e.g., by not flipping a bit), determining whether to change a value of the variable node, computing a function of the score for the variable node and the corresponding bit of the received code word, determining whether a bit of the variable node should match or invert the corresponding bit of the received code word, or the like. Thus, in one embodiment, the variable node update module 304 may update a variable node by changing the value of the variable node, but in another embodiment, or in another iteration, the variable node update module 304 may update a variable node by leaving the value of the variable node unchanged.

In one embodiment, the variable node update module 304 may update a variable node based on the score by determining whether the score satisfies a score threshold (e.g., by comparing the score to a threshold value), to determine whether to flip a bit value for the variable node relative to the corresponding bit of the received code word. In some embodiments, the variable node update module 304 may assign a variable node a flipped value relative to the corresponding bit of the received code word in response to the score satisfying the score threshold. As used herein, a "flipped" bit or value refers to an inverted value relative to a value for a bit in the received code word. For example, if a bit from the received code word is a binary zero, and the corresponding variable node is "flipped", then the value of the variable node is changed to a binary one. In further embodiments, the variable node update module 304 may assign a variable node an unflipped value relative to the corresponding bit of the received code word, in response to the score failing to satisfy the score threshold.

Thus, in one embodiment, updating a variable node may include toggling the variable node in response to the score crossing a score threshold. As used herein, "toggling" refers to changing a binary value from a zero to a one or from a one to a zero. Also, as used herein, "crossing a score threshold" refers to a score satisfying a score threshold when the previous score did not satisfy the score threshold (or with no previous score) and/or to a score failing to satisfy a score threshold when the previous score did satisfy the score threshold. So, if the score for a variable node crosses the score threshold, the variable node update module may toggle the bit value for the variable node from a flipped to an unflipped state (or vice versa), relative to the corresponding bit of the received code word.

In one embodiment where a high score indicates an estimated likelihood that the corresponding bit of the received code word is in error, the score may satisfy a score threshold if the score is greater than or equal to a threshold value, and may fail to satisfy the score threshold if the score is less than the threshold value. For example, continuing the three-bit score example described above, where the score is in a range from zero to seven, the threshold value may be four, so that a score greater than or equal to four may satisfy the score threshold, and a score less than four may fail to satisfy the threshold. In some embodiments, the score may be a multiple-bit value, and the most significant bit of the multiple-bit value may indicate whether the score satisfies the score threshold. For example, in one embodiment, the score threshold may be selected so that the score satisfies the score threshold if the most significant bit of the score is a one, and fails to satisfy the score threshold if the most significant bit of the score is a zero. In various embodiments, the variable node update module 304 may use various score thresholds to determine whether to flip a bit value for the variable node.

In one embodiment, if the score for a variable node is high, then the corresponding bit of the received code word is estimated to be in error. Thus, in a further embodiment, the variable node update module 304 determines that the bit value for the variable node should be flipped in comparison to the corresponding bit of the received code word, in response to the score satisfying the score threshold. In still further embodiments, if the score for a variable node is low, then the corresponding bit of the received code word is estimated to be correct. Thus, in some embodiments, the variable node update module 304 determines that the bit value for the variable node should not be flipped in comparison to the corresponding bit of the received code word, in response to the score failing to satisfy the score threshold. In either case, having determined whether the variable node value should be flipped in comparison to the corresponding bit in the received code word, the variable node update module 304 may compare the value of the variable node to the bit of the received code word, and update the variable node accordingly.

In one embodiment, the variable node update module 304 may use an exclusive OR (XOR) operation to update a variable node. In certain embodiments, logic hardware for the variable node update module 304 may include adders, a XOR gates, or the like. In a further embodiment, continuing the example above where a multiple-bit score satisfies the score threshold if the most significant bit of the score is a one, the value for the updated variable node may be the result of the variable node update module 304 applying an XOR operation to the most significant bit of the score and the corresponding bit of the received code word. Thus, for example, if the score is a three bit value in a range from zero to seven, then the most significant bit of the score is a one if the score is in a range from four to seven. If the score is high, so that the most significant bit of the score is a one, then the score satisfies the score threshold, and the corresponding bit of the received code word is estimated to be in error. So, in a further embodiment, the variable node update module 304 may update a variable node by applying an XOR operation to the one in the most significant bit of the score and the corresponding bit of the received code word, so that the updated variable node has a bit value that is flipped relative to the corresponding bit of the received code word.

Similarly, in another embodiment, or in another iteration of the variable node update module 304, if the score is a three bit value in a range from zero to seven, then the most significant bit of the score is a zero if the score is in a range from zero to three. If the score is low, so that the most significant bit of the score is a zero, then the score fails to satisfy the score threshold, and the corresponding bit of the received code word is estimated to be correct. So, in a further embodiment, the variable node update module 304 may update a variable node by applying an XOR operation to the zero in the most significant bit of the score and the corresponding bit of the received code word, so that the updated variable node has a bit value that is not flipped, but is the same as the corresponding bit of the received code word.

The check node update module 306, in one embodiment, is configured to update or revise one or more of the check nodes. In one embodiment, the check node update module 306 may update check nodes based on an updated or revised variable node. In another embodiment, the check node update module 306 may update check nodes based directly on the scores, by toggling the check nodes associated with a variable node if the score for the variable node crosses a score threshold. In a further embodiment, the check node update module 306 may iteratively update one or more of the check nodes based on the updated variable nodes. In various embodiments, a means for toggling one or more check nodes may include a check node update module 306, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for updating check nodes.

In various embodiments, "updating" a check node may refer to determining an updated value for a check node based on the updated variable nodes, whether or not the check node update module 306 changes the value of the check node. As described above, the value of a check node may be binary one or zero, based on the product, modulo 2, of the parity check matrix and the variable nodes. Thus in one embodiment, if the variable node update module 304 toggles an odd number of the variable nodes connected to a check node, in one iteration, then the check node update module 306 may update the check node by toggling the binary value of the check node. In another embodiment, or in another iteration, if the variable node update module 304 toggles an even number of the variable nodes connected to the check node, then the check node update module 306 may update the check node by leaving the value of the variable node unchanged.

In certain embodiments, as described above, the parity check matrix may be a matrix of cyclically shifted N by N identity matrices. In some embodiments, the score module 302 may assign a score to a group of N variable nodes, and the variable node update module 304 may update the group of N variable nodes based on the scores. Then, if the check node update module 306 has previously calculated values for the check nodes, then the check node update module 306 may update a group of N check nodes by reading the group of N updated variable nodes, shifting the group of variable nodes according to the corresponding cyclically shifted identity matrix, and adding the result, modulo 2, (e.g., by performing an XOR operation) to the previously calculated values for the check nodes. On a first iteration, in one embodiment, the check node update module 306 may preprocess the check nodes by cyclically shifting each group of N variable nodes and adding the results modulo 2. Then, in further iterations, or in a further embodiment, the score module 302, variable node update module 304, and check node update module 306 may handle a number of variable nodes in each iteration corresponding to the size of one of the cyclically shifted identity matrices, so that if the cyclically shifted matrices are N by N matrices, the score module 302, variable node update module 304, and check node update module 306 may handle groups of N variable nodes. Accordingly, in a certain embodiment, logic hardware for a check node update module 306 may include barrel shifters (or other types of shifters) and adders for calculating values of check nodes by shifting and adding groups of variable nodes.

In one embodiment, the score module 302, variable node update module 304, and check node update module 306 may proceed to a subsequent iteration after handling a group of N variable nodes. In a further embodiment, the next iteration may assigning a score (or an updated score) to the next group of N variable nodes, updating the group of N variable nodes based on the score, and updating the check nodes based on the group of N updated variable nodes. An LDPC code decoder iterating for each group of N variable nodes may provide high error correcting performance, as updates for previous groups of N variable nodes are propagated, via scores based on the updated check nodes, to a current group of N variable nodes. Accordingly, an LDPC code decoder iterating for each group of N variable nodes may correct errors efficiently, without explicitly passing messages among variable nodes and check nodes.

In one embodiment, the ECC decoder module 150 may be an LDPC code decoder, and the score module 302, variable node update module 304, and check node update module 306 may be modules of the LDPC code decoder. Thus, in a certain embodiment, the LDPC code decoder may assign scores, update variable nodes, and update one or more of the check nodes. In one embodiment, the LDPC code decoder may be a software decoder. For example, in a further embodiment, a driver, such as the SML 130 may implement a software LDPC code decoder for the computing device 110. In another embodiment, the LDPC code decoder may be implemented using a mixture of hardware and software elements. In certain embodiments, the LDPC code decoder may be a hardware decoder. For example, in one embodiment, the LDPC code decoder may be implemented using hardware of the non-volatile memory media controller 126, such as a field-programmable gate array (FPGA) or other programmable logic, firmware for an FPGA or other programmable logic, microcode for execution on a microcontroller, an application-specific integrated circuit (ASIC), or the like. In a certain embodiment, the LDPC code decoder may include logic hardware and/or executable code. In a further embodiment, the executable code may be stored on a computer readable storage medium.

Figure 4:
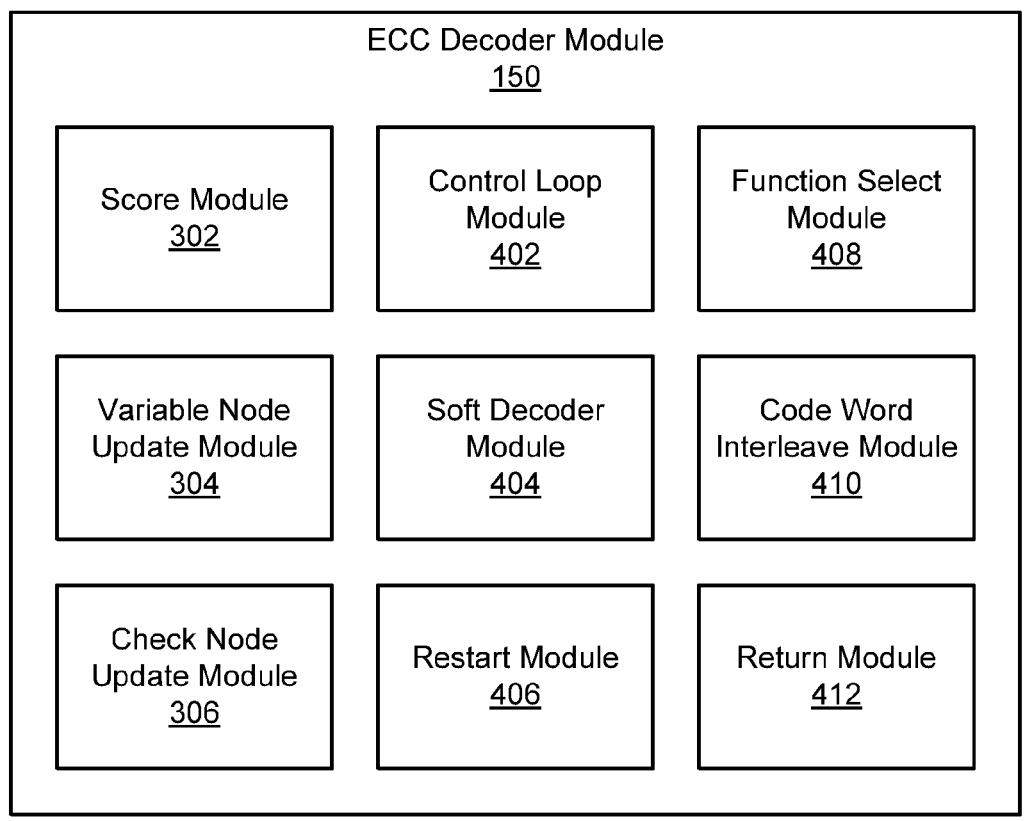
FIG. 4 is a schematic block diagram illustrating another embodiment of a an ECC decoder module.

FIG. 4 depicts another embodiment of an ECC decoder module 150. The ECC decoder module 150, in certain embodiments, may be substantially similar to the ECC decoder module 150 described above with regard to FIG. 1A, FIG. 1B, FIG. 2, and/or FIG. 3. In the depicted embodiment, the ECC decoder module 150 includes a score module 302, a variable node update module 304, and a check node update module 306, which may be configured substantially as described above with regard to FIG. 3. The ECC decoder module 150, in the depicted embodiment, includes a control loop module 402, a soft decoder module 404, a restart module 406, a function select module 408, a code word interleave module 410, and a return module 412.

The control loop module 402, in one embodiment, is configured to stop the iterations of the score module 302, variable node update module 304, and check node update module 306, in response to determining that an iteration termination condition is satisfied. In certain embodiments, satisfying the iteration termination condition may include reaching an iteration limit and/or determining that the plurality of check nodes are satisfied. In one embodiment, the ECC decoder module 150 iteratively revises the score for a variable node (by assigning an updated score), updates the variable node based on the revised score, and updates one or more of the check nodes based on the updated variable node, until the control loop module 402 determines that the plurality of check nodes is satisfied. In a further embodiment, if the plurality of check nodes is satisfied, then the value of each check node is zero, and the bit values of the variable nodes have been corrected to form a valid code word for the LDPC code. Applying a matrix multiplication to the corrected code word reverses the encoding to recover the original, unencoded message. Thus, in a certain embodiment, if the control loop module 402 determines that the check nodes are satisfied, then hard-decoding the LDPC code using scored variable nodes has been successful.

In another embodiment the ECC decoder module 150 iteratively assigns an updated score to a variable node, updates the variable node based on the updated score, and updates one or more of the check nodes based on the updated variable node, until the control loop module 402 determines that the ECC decoder module 150 has reached an iteration limit. An iteration limit, in various embodiments, may include a condition that for ending the iterations of the ECC decoder module 150 without fully correcting the code word. For example, in one embodiment, an iteration limit may indicate a maximum number of iterations for the ECC decoder module 150. In a further embodiment, the control loop module 402 determining that the check nodes are not satisfied but that the ECC decoder module 150 has reached the iteration limit, or the maximum number of iterations, may indicate that the iterations of the score module 302, variable node update module 304, and check node update module 306 have not fully corrected the code word.

In a certain embodiment, reaching the iteration limit may also indicate that the received code word is not likely to be correctable by continuing with further iterations. For example, in one embodiment, if the score module 302 is biased towards high scores, the variable node update module 304 may change a large number of variable nodes in each iteration. In some embodiments, changing a large number of variable nodes in one iteration may result in faster error correction performance. However, in certain embodiments, changing a large number of variable nodes per iteration may result in repeatedly overshooting the correct code word, so that further iterations are unlikely to correct the code word. However, even if the code word is not likely to be correctable by continuing with further iterations, the code word may be correctable in another way, as described below with regard to the soft decision module 404 and the restart module 406. Alternatively, if the code word is uncorrectable, the ECC decoder module 150 may return an uncorrected or partially corrected code word or message.

The soft decoder module 404, in one embodiment, is configured to decode the received code word using a soft LDPC code decoder in response to the control loop module 402 determining that the ECC decoder module 150 has reached the iteration limit. As used herein, a "soft" LDPC code decoder refers to a soft-decision LDPC code decoder, which operates on data that takes on a range of values between zero and one, unlike "hard," or hard-decision LDPC code decoders, which operate on binary data. Data that takes on a range of values between zero and one may be referred to herein as "soft information" In a certain embodiment, the soft decoder module 404 may obtain soft information by re-reading the received code word from the non-volatile memory media 122 using a new set of read voltage thresholds, resistance thresholds, or the like. The soft decoder module 404 uses more bandwidth than a hard decoder for the soft information, and uses more computational overhead for working with the soft information, but the addition of soft information may allow a soft LDPC code decoder to successfully decode the code word if, for example, a hard decoder reached an iteration limit. Using soft LDPC code decoder if a hard decoder has reached an iteration limit provides the higher performance of a soft decoder for difficult error corrections, and provides the low bandwidth, low computational cost, and correspondingly high speed of a hard decoder when the code word is corrected before reaching the iteration limit.

In one embodiment, a hard LDPC code decoder, including the score module 302, variable node update module 304, and check node update module 306 may be implemented by a hardware non-volatile memory device controller 126, to provide high speed correction for regular use. In a further embodiment, a soft decoder for the soft decoder module 404 may be implemented by a driver executed by the processor 111, such as the SML 130, to provide additional correctability at lower speeds when the iteration limit is reached, without complicating the hardware of the non-volatile memory device 120. However, as discussed above, "soft" and "hard" decoders refer to decoders operating on soft information or binary data, respectively, not to software or hardware implementations. In another embodiment, a soft decoder (or a hard decoder) may be implemented using software, hardware, or a mixture of software and hardware.

The restart module 406, in one embodiment, is configured to create an updated code word based on variable nodes updated by the variable node update module 304, and to restart the LDPC code decoder with the plurality of variable nodes corresponding to bits of the updated code word. In various embodiments, a means for creating an updated code word based on the updated variable nodes may include a restart module 406, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Similarly, in various embodiments, a means for restarting the LDPC code decoder with the plurality of variable nodes corresponding to bits of the updated code word may include a restart module 406, an ECC decoder module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for creating an updated code word based on the updated variable nodes, and for restarting the LDPC code decoder.

In one embodiment, the restart module 406 may create an updated code word by reading the values stored or tracked by the updated variable nodes. For example, if the iteration limit has been reached, the restart module 406 may obtain a partially corrected code word from the updated variable nodes. In one embodiment, restarting the LDPC code decoder may include restarting the process of the LDPC code decoder assigning scores, updating variable nodes, and updating check nodes. The restart module 406 may restart the process by causing the score module 302 to reassign scores to variable nodes, so that the scores are based on a count of unsatisfied check nodes associated with each variable node, without regard to a previous score. Thus, by restarting the LDPC code decoder with the plurality of variable nodes corresponding to the updated, or partially corrected code word, the restart module 406 causes the score module 302 to reinitialize the variable node scores, which may break the LDPC code decoder out of a loop and allow the ECC decoder module 150 to fully correct the code word before the iteration limit is reached a second time. In a further embodiment, the restart module 406 may use one or more additional bits per variable node to create and store the updated code word, because the LDPC code decoder may be unable to track values of the variable nodes based on the most significant bit of the score and a corresponding bit of the received code word as the score module 302 reinitializes the scores.

In a certain embodiment, as discussed below with regard to the function select module 408 and with regard to FIG. 5, the score module 302 may select one of at least two functions or mappings available for assigning the score. In a further embodiment, the iteration limit may be reached in iterations where the score module 302 assigns the score using a first function or mapping. In a certain embodiment, the score module 302 may select a second function or mapping for assigning the score in response to the restart module 406 restarting the LDPC code decoder with the plurality of variable nodes corresponding to the updated, or partially corrected code word. In some embodiments, restarting the LDPC controller with an updated code word and a different function or mapping for assigning the score may break the LDPC code decoder out of a loop and allow the ECC decoder module 150 to fully correct the code word before the iteration limit is reached a second time In one embodiment, the score module 302 assigns the scores by using the function select module 408 to select one of at least two functions or mappings that determine the score based on the variable node's previous score and count of unsatisfied check nodes. In a further embodiment, the function select module 408 may select a function or mapping based on an initial count of unsatisfied check nodes for the code word. In a certain embodiment, the score module 302 may use one function or mapping for assigning the score in each iteration, until the iteration limit is reached and the restart module 406 restarts the LDPC code decoder with an updated code word. In a further embodiment, the score module 302 may use another function or mapping for assigning the score in each iteration, in response to the restart module 406 restarting the LDPC code decoder.

In one embodiment, each function or mapping may correlate the score for a variable node with a previous score for the variable node and a count of unsatisfied check nodes associated with the variable node. In a certain embodiment, if the previous score for a variable node satisfies a score threshold, it indicates a previous estimate that the corresponding bit of the received code word is in error. For example, in one embodiment, the previous score may satisfy a score threshold if the previous score is greater than or equal to a threshold value. Thus, unless a high count of unsatisfied check nodes associated with the variable node indicates that the previous estimate is in error, the score should remain high (e.g., at or above the threshold value). However, the score should be decreased in response to a high count of unsatisfied check nodes. Thus, in a further embodiment, each function of the at least two functions (or mappings) may include subtracting the count of unsatisfied check nodes from the previous score in response to the previous score satisfying a score threshold (e.g., if the previous score is high).

In another embodiment, if the previous score for a variable node is low, it indicates a previous estimate that the corresponding bit of the received code word is correct. Thus, unless a high count of unsatisfied check nodes associated with the variable node indicates that the previous estimate is in error, the score should remain low. However, the score should be increased in response to a high count of unsatisfied check nodes. Thus, in a further embodiment, each function or mapping of the at least two functions or mappings may include adding the count of unsatisfied check nodes from the previous score in response to the previous score failing to satisfy a score threshold (e.g., if the previous score is low).

Additionally, in one embodiment, each function or mapping may include adjusting a result using one or more adjustment factors. In certain embodiments, an adjustment factor may be a positive number, a negative number, or zero, and adjusting a result may include adding an adjustment factor, subtracting an adjustment factor, scaling the result by an adjustment factor, or the like. In a further embodiment, adjusting a result may also include applying an additional operation, such as rounding or truncating a scaled value, or the like.

In one embodiment, adjusting the result for a mapping by an adjustment factor may tend to keep high scores high and low scores low, so that the score module 302 may assign a score in one iteration that does not differ too much from a previous score in a previous iteration. Keeping the score module 302 from changing scores too quickly may prevent the variable node update module 304 from changing the values of too many variable nodes at once, and avoid loops that occur when the values for the variable nodes repeatedly overshoot the correct values. Conversely, the adjustment factors may be selected for another function or mapping to allow the variable nodes to change more quickly.

In another embodiment, if the raw error rate for the non-volatile memory media 122 is below 50%, most bits of a received code word are likely correct, and so an adjustment factor for a function or mapping may bias the results toward lower scores. In a further embodiment, a first function or mapping may apply little to no bias, or may be biased toward higher scores, and may quickly update variable nodes to produce a corrected code word if the received code word contains few errors. However, if the code word contains more errors (for example, if over 200 check nodes are unsatisfied for the 17,920 bit code word discussed above), then a very high count of unsatisfied check nodes associated with a variable node may indicate that the corresponding bit of the received code word is actually correct, so the score should be low. Accordingly, in one embodiment, a second function or mapping may apply a larger bias towards reducing the scores in subsequent iterations. Thus, in a certain embodiment, the adjustment factors for first and second functions of the at least two functions are selected so that a value returned by the second function is less than or equal to a value returned by the first function.

The function select module 408 may select the second function or mapping so that the score module 302 assigns lower scores, keeping more bit values for variable nodes unflipped compared to the corresponding bits in the received code word, to increase the likelihood of converging to the correct answer for a code word with a high initial count of unsatisfied check nodes, even if the number of iterations increases. Conversely, the function select module 408 may select the first function or mapping so that the LDPC code decoder uses fewer iterations, but may increase the risk that the variable nodes may not converge to the correct answer. In one embodiment, the function select module 408 may select a function or mapping based on the initial count of unsatisfied check nodes for the code word.

The functions and mappings heretofore described may, in various embodiments, be restricted or bounded to a range for the score. For example, in one embodiment, if the score may be in a range from one to seven, a function or mapping may return a score of zero, instead of a negative score, and may return a score of seven instead of a score greater than seven. Restricting the score to a particular range allows the score to be stored with a small number of bits (e.g., three bits for scores from one to seven). In various embodiments, logic hardware for the functions or mappings may include various components. For example, in one embodiment, the score module 302 may include an ASIC, including adders and comparators for calculating a score. In another embodiment, the score module 302 may assign the score based on a pre-computed lookup table of an FPGA, that maps input values (e.g., previous scores and counts of unsatisfied check nodes) to output values (e.g., scores) for the selected function. In a further embodiment, an FPGA may include more than one lookup table, for more than one function or mapping. In various further embodiments, the functions or mappings may be implemented in various ways. Lookup tables of two functions are described below with regard to FIG. 5.

The code word interleave module 410, in one embodiment, is configured to interleave decoding for at least two code words by assigning a score to a variable node for a first code word while updating one or more check nodes for a second code word. In a certain embodiment, the code word interleave module 410 may cause the score module 302 to assign a score to a variable node of a first code word by calculating the score based on a function, or mapping of a previous score for each variable node and the count of unsatisfied check nodes for each variable node. In some embodiments, the score module 302 may use logic hardware such as adders or XOR gates to calculate the score. In a further embodiment, where the parity check matrix for the LDPC code decoder comprises a matrix of cyclically shifted identity matrices, the code word interleave module 410 may cause the check node update module 306 to update the check nodes by cyclically shifting a group of N variable nodes by an amount corresponding to a different cyclically shifted identity matrix for each group of N check nodes. The code word interleave module 410 may use logic hardware of the LDPC code decoder efficiently by using barrel shifters, or the like, to update check nodes by cyclically shifting the variable nodes for one code word, while using adders, or the like, to assign scores to variable nodes of another code word. By interleaving decoding for at least two code words, the code word module 410 may increase the speed and/or throughput of the LDPC code decoder. For example, one iteration for a first code word may begin by calculating scores and revising variable nodes for the first code word, while another iteration for a second code word finishes by revising check nodes for the second code word. The iteration for the first code word may then finish by revising check nodes for the first code word while a new iteration for the second code word begins calculating scores and revising variable nodes for the second code word. Handling iterations of different code words simultaneously, or in parallel in certain embodiments, provides increased throughput for a given set of hardware. In another embodiment, the ECC decoder module 150 may further increase throughput by decoding more than two code words simultaneously, interleaving two code words for each of several parallel LDPC code decoders.

The return module 412, in one embodiment, is configured to decode the code word based on the revised variable nodes in response to the plurality of check nodes being satisfied. With the plurality of check nodes satisfied, the values of the variable nodes have been revised to form a valid code word for the LDPC code. The return module 412, in certain embodiments, receives the valid code word from the revised variable nodes, and decodes the code word. In one embodiment, decoding the code word may include applying a matrix multiplication to the code word that reverses the effect of the generator matrix, to recover the original, message. In a further embodiment, the return module 412 may return the decoded message to a client 116. In another embodiment, the return module 412 may decode the code word as part of a garbage collection or grooming process, to validate data before it is reencoded and stored in a different location for the non-volatile memory media 122.

FIG. 5 depicts a set of tables illustrating two embodiments of functions 510, 520 (or mappings) for scoring variable nodes. The tables for each function 510, 520 are pre-computed in the depicted embodiment, and may be used to assign the score using lookup tables of an FPGA or other programmable logic, for example. In other embodiments, as described above, the score module 302 may dynamically determine a score at runtime, without using pre-computed values in a table or mapping, but by entering a count of unsatisfied check nodes and a previous score into a mathematical function to determine an updated score value. In the depicted embodiment, the first function 510 and the second function 520, instead comprise lookup tables with pre-computed scores, indexed by the count of unsatisfied check nodes and the previous score for the variable node.

A variety of bit widths for a score and column weights are possible for various LDPC code decoders in a variety of embodiments; however, in the depicted embodiment, tables use a three bit score in a range from zero to seven, with a score threshold that is satisfied if the score is greater than or equal to four, and a column weight of five for the parity check matrix, so that the count of unsatisfied check nodes associated with a variable node is in a range from zero to five. Each function 510, 520 includes subtracting the count of unsatisfied check nodes from the score if the previous score is high, and adding the count of unsatisfied check nodes to the previous score if the previous score is low. Adjustment factors are selected so that any value for the second function 520 is less than or equal to a corresponding value for the first function 510, as described above.

Thus, in the depicted embodiment, the first function 510 produces a score equal to the previous score minus the count of unsatisfied check nodes, plus 1, clamped in a range from zero to seven, if the previous score is greater than or equal to four. If the previous score is less than four, the first function 510 produces a score equal to the previous score plus the count of unsatisfied check nodes, minus two, again clamped in a range from zero to seven.

Similarly, in the depicted embodiment, the second function 520 produces a score equal to the previous score minus the count of unsatisfied check nodes, clamped in a range from zero to seven, if the previous score is greater than or equal to four. If the previous score is less than four, the second function 520 produces a score equal to the previous score plus the count of unsatisfied check nodes, minus two, again clamped in a range from zero to seven. The adjustment factors for the second function 520 differ from the adjustment factors for the first function 510, because the second function does not include adding a one to the score if the previous score is high. Thus, the value returned by the second function 520 will be less than or equal to a value returned by the first function 510. Accordingly, as described above, the function select module 408 may select the second function for scoring the variable nodes so that the LDPC code decoder is biased in the direction of keeping variable nodes the same as the corresponding bits of the received code word. So, the second function increases the likelihood of obtaining a fully corrected code word, but increases the number of iterations.

Figure 6:
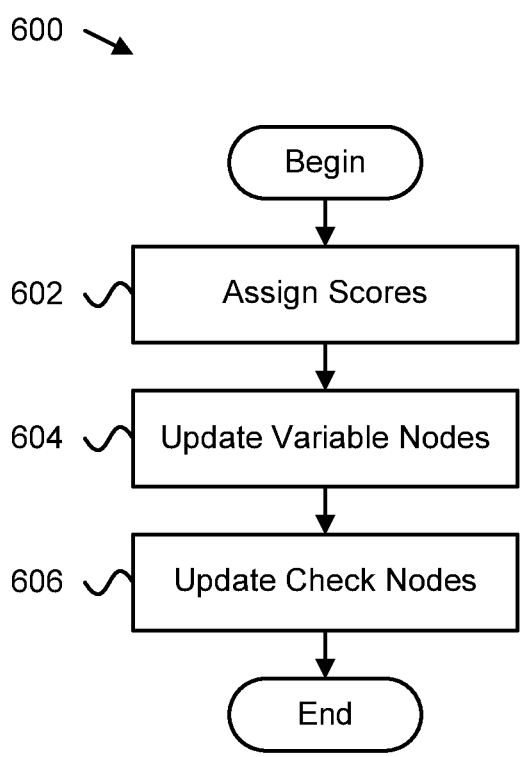
FIG. 6 is a schematic flow chart diagram illustrating one embodiment of a method for ECC decoding.

FIG. 6 depicts one embodiment of a method 600 for ECC decoding. The method 600 begins, and the score module 302 assigns 602 scores to variable nodes of an LDPC code decoder. In one embodiment, the LDPC code decoder may include a plurality of variable nodes associated with a plurality of check nodes. In a further embodiment, the plurality of variable nodes may correspond to bits of a received code word. In certain embodiments, the score for the variable node may be based on a count of unsatisfied check nodes associated with the variable node. The variable node update module 304 updates 604 one or more of the variable nodes based on the score for each variable node. The check node update module 306 updates 606 one or more of the check nodes based on the updated variable nodes, and the method ends.

Figure 7:
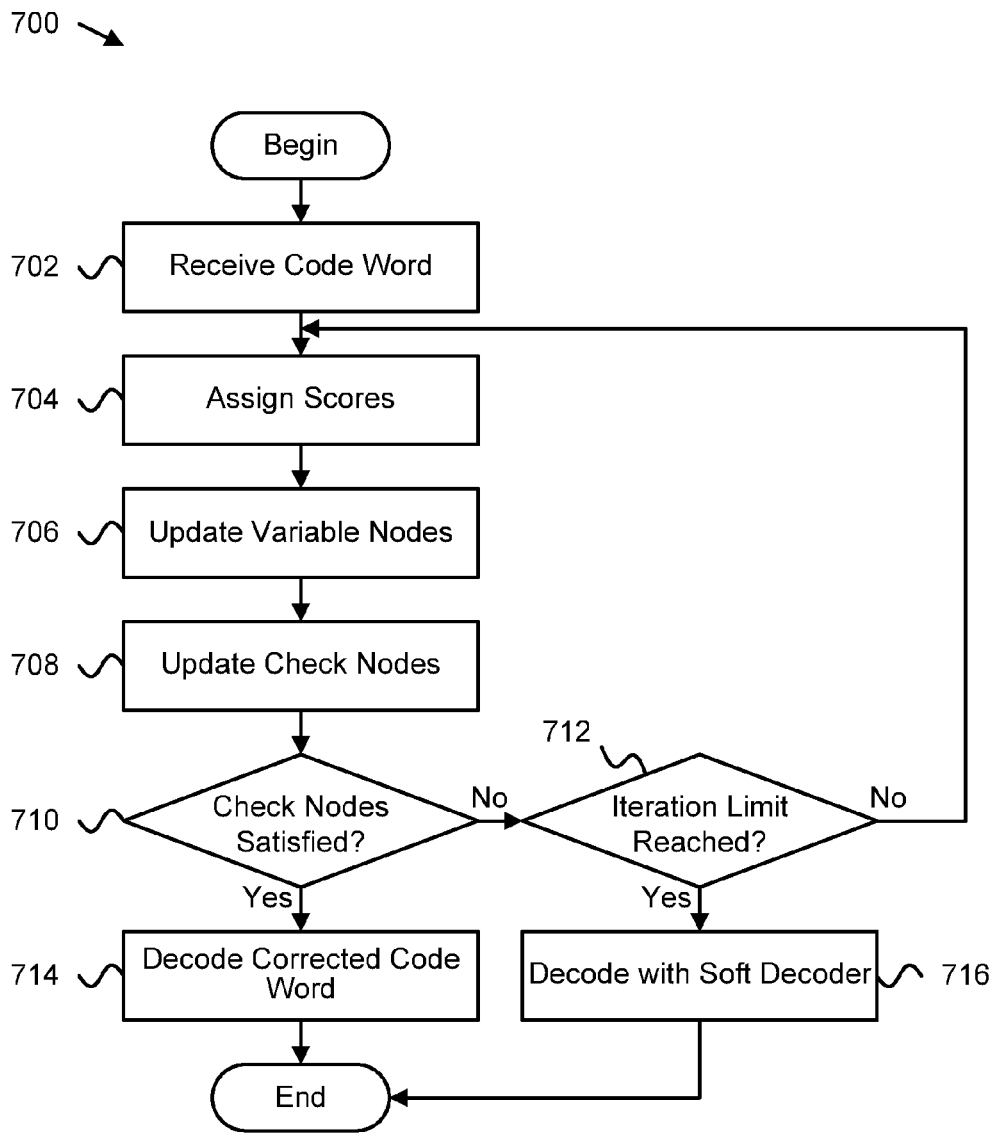
FIG. 7 is a schematic flow chart diagram illustrating another embodiment of a method for ECC decoding.

FIG. 7 depicts another embodiment of a method 700 for ECC decoding. The method 600 begins, and the ECC decoder module 150 receives 702 a code word from non-volatile memory media 122. An iteration of the ECC decoder module 150, begins, and the score module 302 assigns 704 scores to variable nodes of an LDPC code decoder. In one embodiment, the LDPC code decoder may include a plurality of variable nodes associated with a plurality of check nodes. In a further embodiment, the plurality of variable nodes may correspond to bits of a received code word. In certain embodiments, the score for the variable node may be based on a count of unsatisfied check nodes associated with the variable node. The variable node update module 304 updates 706 one or more of the variable nodes based on the score for each variable node. The check node update module 306 updates 708 one or more of the check nodes based on the updated variable nodes. The control loop module 402 determines 710 whether the check nodes are satisfied. If the check nodes are not satisfied, the control loop module 402 determines 712 whether the ECC module 150 has reached an iteration limit. If the iteration limit is not reached, the control loop module 402 begins a new iteration of the ECC decoder module 150, the score module 302 assigns 704 updated scores to variable nodes, and the method 700 continues. If the check nodes are satisfied, then the return module 412 decodes 714 a corrected code word based on the updated variable nodes, to obtain the original, unencoded message, and the method 700 ends. If the iteration limit is reached, the soft decoder module 404 decodes 716 the code word using a soft decoder (e.g., a soft-decision LDPC code decoder), and the method 700 ends.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
    assigning a score to a variable node of a hard-decision low density parity check (LDPC) code decoder comprising a plurality of variable nodes associated with a plurality of check nodes, the plurality of variable nodes corresponding to bits of a received code word, the score for the variable node based on a count of unsatisfied check nodes associated with the variable node;
    updating the variable node based on the score; and
    updating one or more of the check nodes based on the updated variable node.

2. The method of claim 1, wherein the score for the variable node indicates an estimated likelihood that a corresponding bit of the received code word is in error.

3. The method of claim 1, further comprising iteratively, until an iteration termination condition is satisfied:
    revising the score for the variable node;
    updating the variable node based on the revised score; and
    updating one or more of the check nodes based on the updated variable node, wherein the iteration termination condition is satisfied in response to one or more of an iteration limit being reached and the plurality of check nodes being satisfied.

4. The method of claim 3, further comprising decoding the received code word using a soft LDPC code decoder in response to reaching the iteration limit.

5. The method of claim 1, wherein the LDPC code decoder assigns the score, updates the variable node, and updates one or more of the check nodes, the LDPC code decoder comprising one or more of logic hardware and executable code, the executable code stored on a computer readable storage medium.

6. The method of claim 1, wherein the LDPC code decoder assigns the score, updates the variable node, and updates one or more of the check nodes, the method further comprising:
creating an updated code word based on the updated variable node; and
restarting the LDPC code decoder with the plurality of variable nodes corresponding to bits of the updated code word, wherein restarting the LDPC code decoder comprises reassigning a score to the variable node, the score based on a count of unsatisfied check nodes associated with the variable node, without regard to a previous score.

7. The method of claim 1, wherein updating the variable node based on the score comprises one or more of assigning the variable node a flipped value relative to a corresponding bit of the received code word in response to the score satisfying a score threshold, and assigning the variable node an unflipped value relative to the corresponding bit of the received code word in response to the score failing to satisfy the score threshold.

8. The method of claim 1, wherein the score comprises a multiple-bit value and a most significant bit of the multiple-bit value indicates whether the score satisfies a score threshold.

9. The method of claim 1, wherein assigning the score to the variable node comprises selecting, based on an initial count of unsatisfied check nodes, one of at least two functions that determine the score based on a previous score for the variable node, and the count of unsatisfied check nodes associated with the variable node.

10. The method of claim 9, further comprising determining the score based on a pre-computed lookup table mapping input values to output values for the selected function.

11. The method of claim 9, wherein each function of the at least two functions comprises subtracting the count of unsatisfied check nodes from the previous score in response to the previous score satisfying a score threshold, and adding the count of unsatisfied check nodes to the previous score in response to the previous score failing to satisfy the score threshold, wherein a previous score satisfying the score threshold comprises a previous score greater than or equal to a threshold value.

12. The method of claim 11, further comprising adjusting a result for each function using one or more adjustment factors.

13. The method of claim 12, wherein the adjustment factors for first and second functions of the at least two functions are selected so that a value returned by the second function is less than or equal to a value returned by the first function.

14. The method of claim 1, further comprising interleaving decoding for at least two code words by assigning a score to a variable node for a first code word while updating one or more check nodes for a second code word.

15. An apparatus comprising:
a score module of a hard-decision low density parity check (LDPC) code decoder, a plurality of variable nodes of the LDPC code decoder corresponding to bits of a received code word, the score module configured to iteratively calculate scores for the variable nodes, the score for a variable node based on a count of unsatisfied check nodes associated with the variable node;
a variable node update module of the LDPC code decoder, the variable node update module configured to iteratively revise one or more of the variable nodes based on the score; and
a check node update module of the LDPC code decoder, the check node update module configured to iteratively revise one or more of the check nodes based on the revised variable nodes.

16. The apparatus of claim 15, further comprising a control loop module configured to stop the iterations of the score module, the variable node update module, and the check node update module in response to one or more of an iteration limit being reached and the plurality of check nodes being satisfied.

17. The apparatus of claim 16, further comprising a return module configured to decode the code word based on the revised variable nodes in response to the plurality of check nodes being satisfied.

18. The apparatus of claim 15, wherein a parity check matrix for the LDPC code decoder comprises a matrix of cyclically shifted identity matrices, and each iteration of the score module, the variable node update module, and the check node update module handles a number of variable nodes corresponding to a size of one of the cyclically shifted identity matrices.

19. The apparatus of claim 15, further comprising a restart module configured to:
create an updated code word based on the revised variable nodes; and
restart the apparatus with the plurality of variable nodes corresponding to bits of the updated code word, wherein restarting the apparatus comprises recalculating scores for the variable nodes, the score for a variable node based on a count of unsatisfied check nodes associated with the variable node, without regard to a previous score.

20. The apparatus of claim 15, further comprising a code word interleave module configured to interleave decoding for at least two code words by calculating scores and revising variable nodes in an iteration for a first code word while revising check nodes in an iteration for a second code word, and by revising check nodes in the iteration for the first code word while calculating scores and revising variable nodes in a new iteration for the second code word.

21. An apparatus comprising:
means for determining a score for a message node of a plurality of message nodes for a hard-decision error correcting code (ECC) decoder, the plurality of message nodes corresponding to bits of a received code word, the score for the message node based on a count of unsatisfied check nodes associated with the message node, wherein determining the score for the message node comprises one or more of adding and subtracting the count of unsatisfied check nodes associated with the message node to a previous score for the message node;
means for toggling the message node in response to the score crossing a score threshold; and
means for toggling check nodes associated with the message node in response to the score crossing the score threshold.

22. The apparatus of claim 21, further comprising:
means for creating an updated code word based on the toggled message node; and means for restarting the apparatus with the plurality of message nodes corresponding to bits of the updated code word, wherein restarting the apparatus comprises re-determining a score for the message node, the score based on a count of unsatisfied check nodes associated with the message node, without regard to a previous score.

* * * * *